(12) United States Patent
Park

(10) Patent No.: US 11,958,275 B2
(45) Date of Patent: Apr. 16, 2024

(54) DISPLAY APPARATUS AND METHOD FOR MANUFACTURING THE SAME

(71) Applicant: LG DISPLAY CO., LTD., Seoul (KR)

(72) Inventor: Chanhyeok Park, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 63 days.

(21) Appl. No.: 17/827,020

(22) Filed: May 27, 2022

(65) Prior Publication Data

US 2023/0059283 A1 Feb. 23, 2023

(30) Foreign Application Priority Data

Aug. 19, 2021 (KR) .......................... 10-2021-0109233

(51) Int. Cl.
| B32B 3/00 | (2006.01) |
| B32B 3/04 | (2006.01) |
| B32B 15/04 | (2006.01) |
| B32B 15/20 | (2006.01) |
| B32B 7/12 | (2006.01) |

(52) U.S. Cl.
CPC ............... B32B 3/04 (2013.01); B32B 15/04 (2013.01); B32B 15/20 (2013.01); B32B 7/12 (2013.01); *B32B 2457/20* (2013.01)

(58) Field of Classification Search
CPC ........... B32B 3/04; B32B 15/04; B32B 15/20; B32B 7/12; B32B 2457/20
USPC ........................................................ 428/192
See application file for complete search history.

(56) References Cited

U.S. PATENT DOCUMENTS

| 9,171,822 | B2 | 10/2015 | Kangastupa et al. |
| 11,805,609 | B2* | 10/2023 | Park .................. H05K 5/03 |
| 2013/0027892 | A1* | 1/2013 | Lim ................... H04M 1/185 |
| | | | 361/679.01 |
| 2018/0166507 | A1* | 6/2018 | Hwang .............. G06F 3/04166 |
| 2020/0365823 | A1 | 11/2020 | Yug |
| 2021/0245297 | A1 | 8/2021 | Ohtani et al. |
| 2023/0059283 | A1* | 2/2023 | Park .................. B32B 15/20 |

FOREIGN PATENT DOCUMENTS

| KR | 10-2013-0111943 A | 10/2013 |
| KR | 10-2020-0133099 A | 11/2020 |
| KR | 10-2021-0003847 A | 1/2021 |

* cited by examiner

*Primary Examiner* — Betelhem Shewareged

(74) *Attorney, Agent, or Firm* — Birch, Stewart, Kolasch & Birch, LLP

(57) ABSTRACT

A display apparatus includes a display panel, a back plate disposed on one surface of the display panel, and a cushion plate. The cushion plate includes an adhesive member disposed on one surface of the back plate, and a conductive structure disposed on one surface of the adhesive member, wherein the conductive structure covers each of a side surface of the adhesive member, a side surface of the back plate, and a side surface of the display panel.

24 Claims, 14 Drawing Sheets

DISPLAY APPARATUS AND METHOD FOR MANUFACTURING THE SAME

CROSS-REFERENCE TO RELATED APPLICATION

This application claims priority under 35 U.S.C. § 119 to Korean Patent Application No. 10-2021-0109233 filed on Aug. 19, 2021 in the Korean Intellectual Property Office, the entire contents of which in its entirety are herein expressly incorporated by reference into the present application.

BACKGROUND OF THE DISCLOSURE

Field

The present disclosure relates to a display apparatus and a method for manufacturing the same, and more particularly, to a display apparatus capable of improving a grounding function and lowering image quality deterioration, and a method for manufacturing the same.

Description of Related Art

A display apparatus is used in a variety of forms and manners in televisions, monitors, smart phones, tablet PCs, notebooks, wearable devices, and the like. Among the display apparatuses used in the various forms and manners, an organic light-emitting display apparatus (OLED) is developed.

The organic light-emitting display apparatus has a self-emissive element in which the element itself generates light, and thus does not require a separate light source, and thus implements display apparatuses which are bendable or have various designs. Further, the organic light-emitting display apparatus can be thinner compared to a liquid crystal display apparatus (LCD) or a plasma display apparatus (PDP) and has advantages of excellent color rendering, a large viewing angle, a high contrast ratio, and a fast response speed. Thus, use of the organic light-emitting display apparatus is gradually increasing.

The organic light-emitting display apparatus includes a display area for displaying a screen and a non-display area formed along an outer edge of the display area. Additional components can be disposed in the non-display area, or various connecting components such as a flexible circuit board for connecting the additional components to each other can be disposed in the non-display area.

A thickness and a width of the display apparatus can increase as the display apparatus includes a plurality of additional components. As the thickness and the width of the display apparatus increase, a design and a portability of the display apparatus can be poor. Thus, research on the schemes to reduce the thickness and the width of the display apparatus is in progress.

SUMMARY OF THE DISCLOSURE

A display device constituting a display apparatus includes a display panel, a back plate that complements rigidity of the display panel, and a plurality of components having various functions such as a cushion plate for heat dissipation and shock absorption, and an adhesive member which are laminated with each other.

When a size of the cushion plate is smaller than a size of each of the display panel and the back plate, a weight of the display apparatus can be reduced and a manufacturing cost thereof can be reduced, but the heat dissipation and shock absorption functions thereof can be lowered. Further, a step can occur between the cushion plate and the back plate, so that the display panel may not be supported on the cushion plate, and can protrude and thus can be easily damaged due to external impact.

Accordingly, the inventor of the present disclosure has invented a display device and display apparatus that can improve a grounding function and lower image quality deterioration while the step between the cushion plate, the back plate and the display panel is not formed.

A purpose to be achieved according to one embodiment of the present disclosure is to provide a display device and display apparatus that can improve a heat dissipation function and a grounding function while a step between a cushion plate, a back plate and a display panel is not formed.

Further, a purpose to be achieved according to one embodiment of the present disclosure is to provide a display device and display apparatus that can improve a distribution of charges uniformly while a step between a cushion plate, and a back plate and a display panel is not formed.

In addition, a purpose to be achieved according to one embodiment of the present disclosure is to provide a display device and display apparatus that can reduce occurrence of damage to the display device in a trimming process using a laser device while a step between a cushion plate, a back plate and a display panel is not formed.

Purposes of the present disclosure are not limited to the above-mentioned purposes. Other purposes and advantages of the present disclosure that are not mentioned can be understood based on following descriptions, and can be more clearly understood based on embodiments of the present disclosure. Further, it will be easily understood that the purposes and advantages of the present disclosure can be realized using means shown in the claims and combinations thereof.

A first aspect of the present disclosure provides a display apparatus including a display panel, a back plate disposed on one surface of the display panel, and a cushion plate including an adhesive member disposed on one surface of the back plate, and a conductive structure disposed on one surface of the adhesive member, wherein the conductive structure covers each of a side surface of the adhesive member, a side surface of the back plate, and a side surface of the display panel.

In one implementation of the first aspect, the side surface of the display panel, the side surface of the back plate and the side surface of the adhesive member are aligned with each other.

In one implementation of the first aspect, the conductive structure includes an upper cover disposed on the one surface of the adhesive member, and a side cover extending from the upper cover so as to cover the side surfaces of the back plate, the display panel and the adhesive member.

In one implementation of the first aspect, the side cover horizontally protrudes, by a predefined horizontal dimension, from the side surface of each of the display panel, the back plate and the adhesive member.

In one implementation of the first aspect, the device further comprises an optical film disposed on an opposite surface of the display panel to the one surface of the display panel on which the back plate is disposed, and a cover member disposed on one surface of the optical film.

In one implementation of the first aspect, the conductive structure covers a side surface of the optical film.

In one implementation of the first aspect, a horizontal dimension of a portion of the conductive structure covering the side surface of the display panel is larger than a horizontal dimension of a portion of the conductive structure covering the side surface of each of the adhesive member and the back plate.

In one implementation of the first aspect, upper sides of the display panel, the back plate and the adhesive member are aligned with each other, left sides of the display panel, the back plate and the adhesive member are aligned with each other, and right sides of the display panel, the back plate and the adhesive member are aligned with each other. In other words, among the four sides, three sides except for the lower side can be aligned.

In one implementation of the first aspect, the conductive structure has multiple pores formed therein and includes Cu (copper).

In one implementation of the first aspect, a dimension of the conductive structure horizontally extending from the side surface of each of the back plate, the display panel and the adhesive member is smaller than 60 um.

In one implementation of the first aspect, a portion of the conductive structure covering the side surfaces of the adhesive member, the back plate, and the display panel vertically extends so as to have a flat vertical surface.

In one implementation of the first aspect, the one surface of the back plate on which the adhesive member is disposed is an opposite surface of one surface of the back plate on which the display panel is disposed, the one surface of the adhesive member on which the conductive structure is disposed is an opposite surface of one surface of the adhesive member on which the back plate is disposed.

A second aspect of the present disclosure provides a method for manufacturing a display apparatus, which includes providing a display device including a display panel, a back plate on the display panel, and a cushion plate on the back plate, wherein the cushion plate includes an adhesive member on the back plate, and a conductive structure, wherein the conductive structure includes an upper cover disposed on one surface of the adhesive member, wherein side surfaces of the display panel, the back plate, and the adhesive member are aligned with each other in a line, wherein the conductive structure further includes a side cover extending from the upper cover so as to cover the side surfaces of the adhesive member, the back plate, and the display panel, wherein the side cover has a first horizontal dimension, and performing a laser trimming process for cutting away a portion of the side cover of the conductive structure inwardly from a side end thereof to reduce the first horizontal dimension of the side cover to a second horizontal dimension.

In one implementation of the second aspect, the side cover covers upper, left, and right side surfaces of the display device.

In one implementation of the second aspect, the performing of the laser trimming process is carried out along a cutting line overlapping the side cover of the conductive structure, wherein the cutting line is formed along upper, left and right edges of the display device.

In one implementation of the second aspect, the first horizontal dimension of the side cover is larger than 60 um, and the second horizontal dimension thereof is smaller than 60 um.

In one implementation of the second aspect, the side cover of the conductive structure is constructed so that a horizontal dimension thereof increases as the side cover extends from the adhesive member toward the display panel.

In one implementation of the second aspect, the method further comprises, after the performing of the laser trimming process, disposing an optical film on the display panel, and disposing a cover member on a back surface of the optical film so that the cover member is coupled to the display device.

A third aspect of the present disclosure provides a method for manufacturing a display apparatus, which includes providing a display device including a display panel, a back plate on the display panel, and a cushion plate on the back plate, wherein the cushion plate includes an adhesive member on the back plate, and a conductive structure on the adhesive member, wherein side surfaces of the display panel, the back plate, and the cushion plate are aligned with each other in a line, wherein a trench having a bottom surface and sides walls is defined in an edge portion of the conductive structure, and performing a laser trimming process for cutting a portion of the display device inwardly from a side surface of the display device using the bottom surface of the trench as a cutting line so that the conductive structure melts and flows to form an upper cover disposed on one surface of the adhesive member, and a side cover extending from the upper cover so as to cover the side surfaces of the adhesive member, the back plate, and the display panel.

In one implementation of the third aspect, the trench extends along upper, left and right sides of the display device.

In one implementation of the third aspect, the performing of the laser trimming process is carried out along the cutting line, wherein the cutting line extends along upper, left and right edges of the display device.

In one implementation of the third aspect, a depth of the trench from a top surface of the conductive structure is in a range of 20% to 30% of a total thickness of the conductive structure In one implementation of the third aspect, the side cover of the conductive structure has a horizontal dimension increasing as the side cover extends from the adhesive member toward the display panel.

According to an embodiment of the present disclosure, the heat dissipation function and the grounding function can be achieved without causing the step between the cushion plate, the back plate and the display panel.

Further, according to an embodiment of the present disclosure, the conductive structure covering a side surface of each of the back plate and the display panel is introduced, thereby providing an advantage that electric charges can be uniformly distributed while not being accumulated in a specific location.

Further, according to an embodiment of the present disclosure, the display panel, the back plate, and the cushion plate are formed to have the same area size, thereby providing an advantage that ends of the display panel, the back plate, and the cushion plate can be aligned with each other without causing a step therebetween.

Further, the laser trimming process is performed in a state where the side cover of the conductive structure is formed to protrude by a predefined horizontal dimension from a side end of each of the display panel, the back plate, and the adhesive member, thereby providing an advantage that a uniform surface of the side cover can be achieved while a horizontal dimension thereof can be maintained so that the side cover can cover an entirety of the side surface of the display device.

Further, the laser trimming process is performed while the side cover of the conductive structure protrudes by a predefined horizontal dimension from a side end of each of the display panel, the back plate and the adhesive member, thereby providing an advantage that the display device can be prevented from being cut off during the laser trimming process, so that the display panel, the back plate and the adhesive member can be aligned with each other in a line.

In addition, according to an embodiment of the present disclosure, the trench having a concave bottom surface and both opposing sides walls is defined in an edge portion of the conductive structure, so that an inclination may not be formed in a side surface of the display device during the laser trimming process, and the display panel, the back plate and the adhesive member can be aligned with each other in a line.

Effects of the present disclosure are not limited to the above-mentioned effects, and other effects as not mentioned will be clearly understood by those skilled in the art from following descriptions.

BRIEF DESCRIPTION OF DRAWINGS

The present disclosure will become more fully understood from the detailed description given hereinbelow and the accompanying drawings which are given by way of illustration only, and thus are not limitative of the present disclosure.

DETAILED DESCRIPTION OF THE EMBODIMENTS

Figure 1:
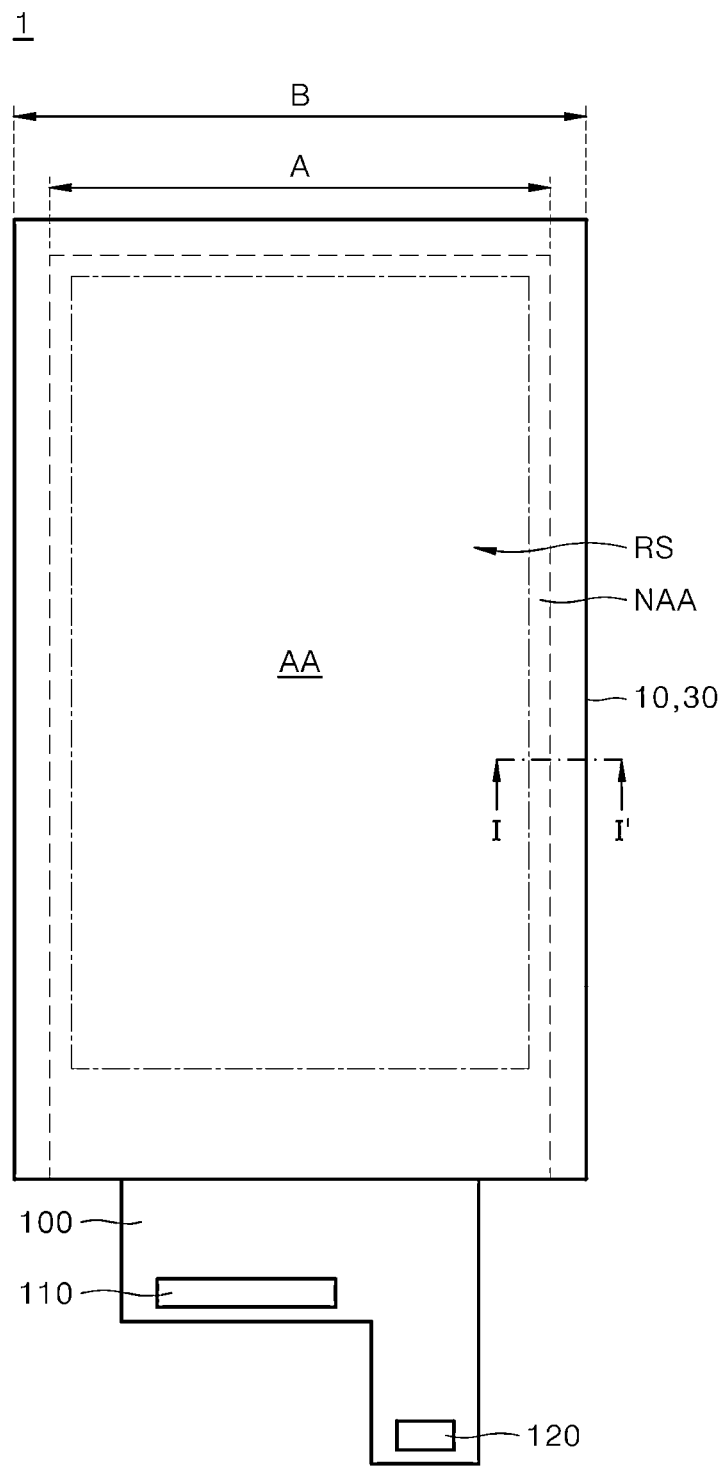
FIG. 1 is a plan view showing a display device according to one embodiment of the present disclosure.

Advantages and features of the present disclosure, and a method of achieving the Advantages and features will become apparent with reference to embodiments described later in detail together with the accompanying drawings. However, the present disclosure is not limited to the embodiments as disclosed below, but can be implemented in various different forms. Thus, these embodiments are set forth only to make the present disclosure complete, and to completely inform the scope of the disclosure to those of ordinary skill in the technical field to which the present disclosure belongs, and the present disclosure is only defined by the scope of the claims.

A shape, a size, a ratio, an angle, a number, etc. disclosed in the drawings for describing the embodiments of the present disclosure are exemplary, and the present disclosure is not limited thereto. The same reference numerals refer to the same elements herein. Further, descriptions and details of well-known steps and elements may be omitted or may be provided briefly for simplicity of the description. Furthermore, in the following detailed description of the present disclosure, numerous specific details are set forth in order to provide a thorough understanding of the present disclosure. However, it will be understood that the present disclosure can be practiced without these specific details. In other instances, well-known methods, procedures, components, and circuits have not been described in detail so as not to unnecessarily obscure aspects of the present disclosure.

The terminology used herein is directed to the purpose of describing particular embodiments only and is not intended to be limiting of the present disclosure. As used herein, the singular constitutes "a" and "an" are intended to include the plural constitutes as well, unless the context clearly indicates otherwise. It will be further understood that the terms "comprise", "including", "include", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements can modify the entire list of elements and may not modify the individual elements of the list. In interpretation of numerical values, an error or tolerance therein can occur even when there is no explicit description thereof.

In addition, it will also be understood that when a first element or layer is referred to as being present "on" a second element or layer, the first element can be disposed directly on the second element or can be disposed indirectly on the second element with a third element or layer being disposed between the first and second elements or layers. It will be understood that when an element or layer is referred to as being "connected to", or "coupled to" another element or layer, it can be directly on, connected to, or coupled to the other element or layer, or one or more intervening elements or layers can be present. In addition, it will also be understood that when an element or layer is referred to as being "between" two elements or layers, it can be the only element or layer between the two elements or layers, or one or more intervening elements or layers can also be present.

Further, as used herein, when a layer, film, region, plate, or the like is disposed "on" or "on a top" of another layer, film, region, plate, or the like, the former can directly contact the latter or still another layer, film, region, plate, or the like can be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former can directly contact the latter or still another layer, film, region, plate, or the like can be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

In descriptions of temporal relationships, for example, temporal precedent relationships between two events such as "after", "subsequent to", "before", etc., another event can occur therebetween unless "directly after", "directly subsequent" or "directly before" is not indicated.

It will be understood that, although the terms "first", "second", "third", and so on can be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

The features of the various embodiments of the present disclosure can be partially or entirely combined with each other, and can be technically associated with each other or operate with each other. The embodiments can be implemented independently of each other and can be implemented together in an association relationship.

As used herein, the term "substantially," "about," and similar terms are used as terms of approximation, and are intended to account for inherent deviations in measured or calculated values that would be recognized by those of ordinary skill in the art. The term can be used to prevent unauthorized exploitation by an unauthorized infringer to design around accurate or absolute figures provided to help understand the present disclosure.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a configuration of each of a display device and a display apparatus will be described in detail with reference to the drawings.

Figure 2:
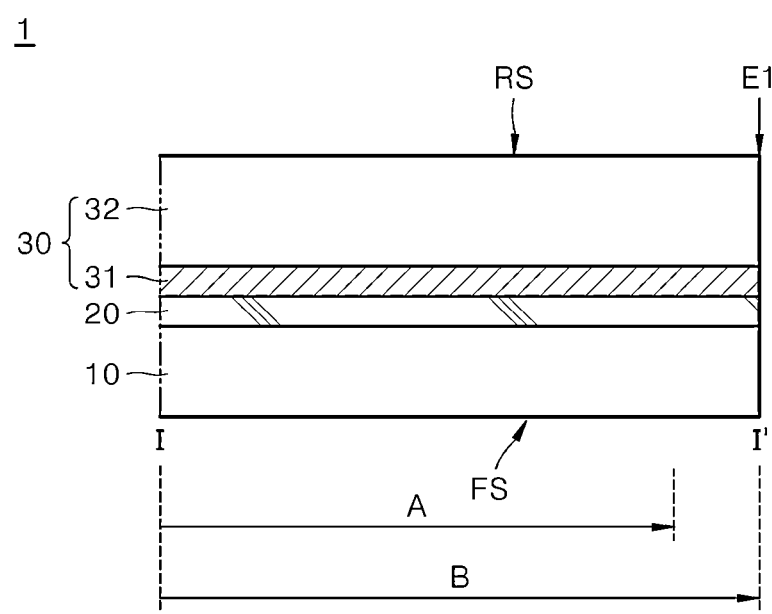
FIG. 2 is a cross-sectional view cut along line I-I' in FIG. 1.
Figure 3:
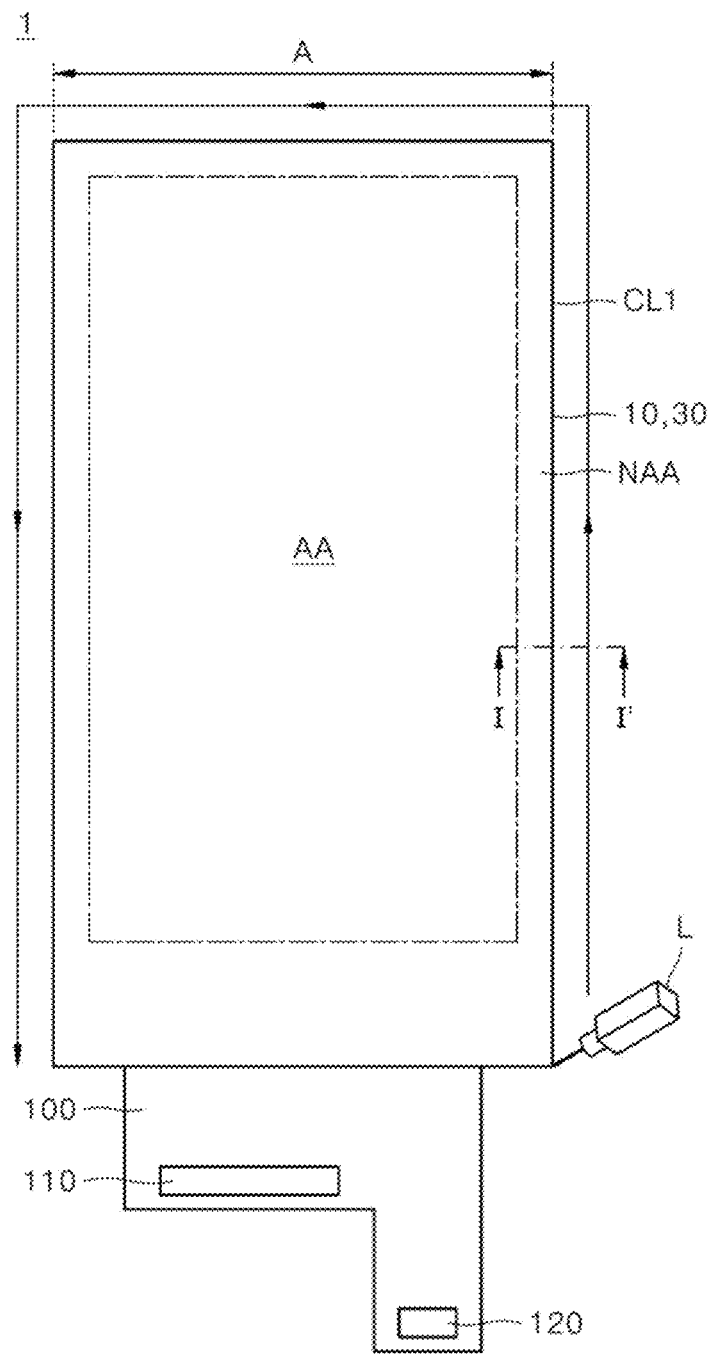
FIG. 3 is a plan view showing a method for performing laser trimming on the display device of FIG. 1.
Figure 4:
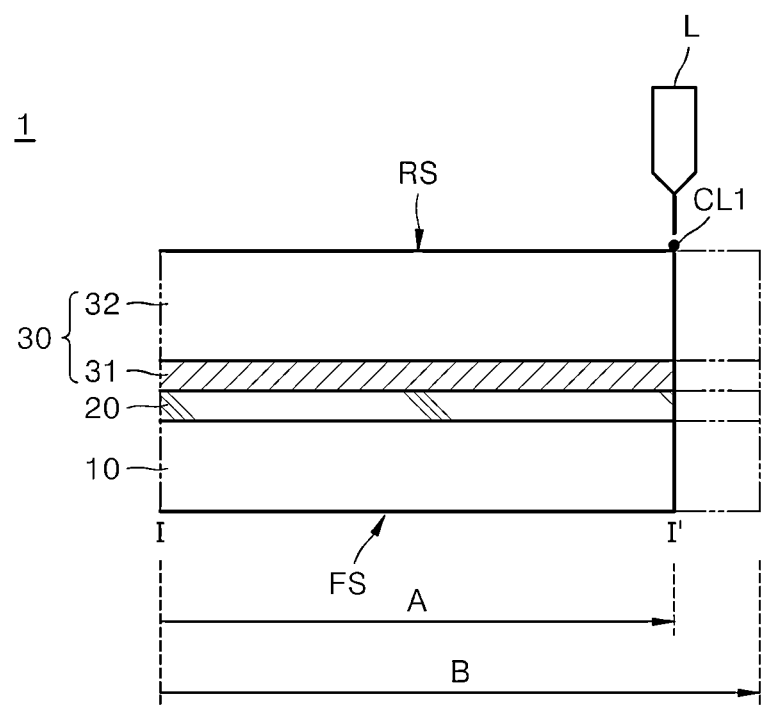
FIG. 4 is a cross-sectional view cut along line I-I' of FIG. 3.
Figure 5:
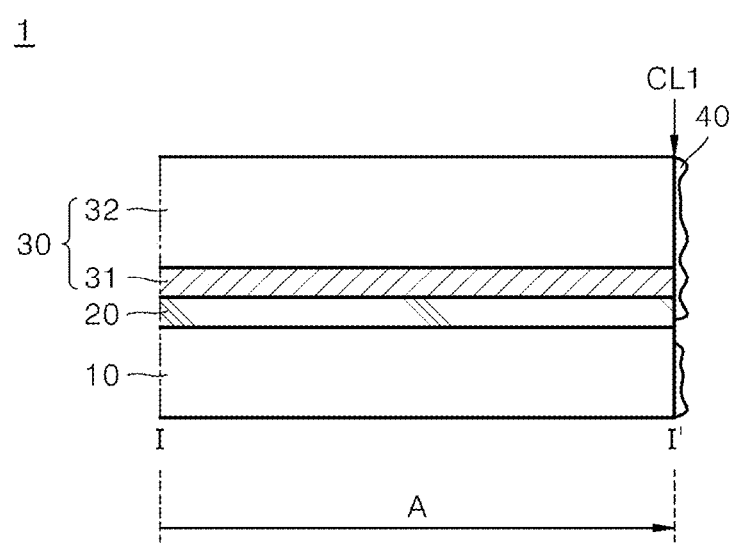
FIG. 5 to FIG. 7 are diagrams showing a structure of the display device after the laser trimming.
Figure 6:
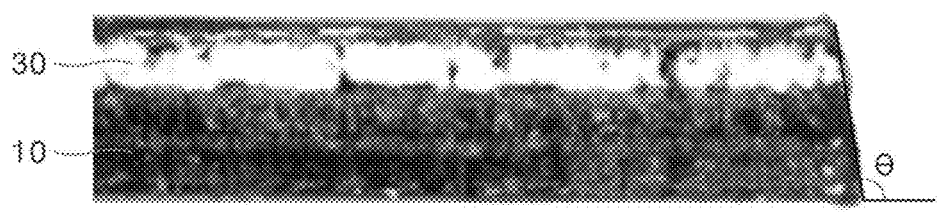
Figure 7:
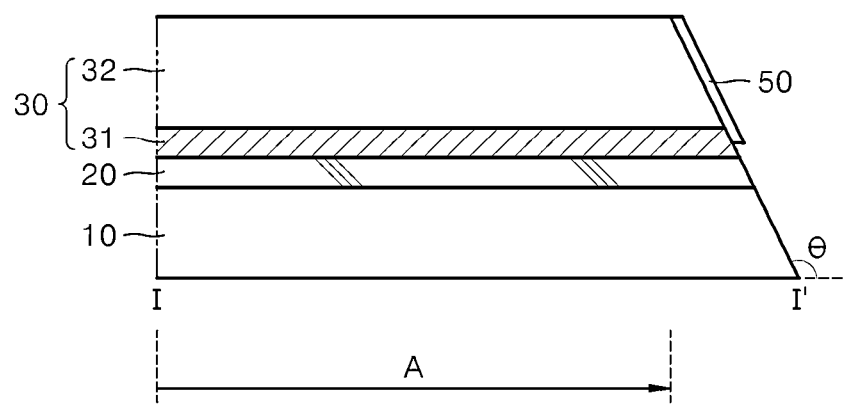

FIG. 1 is a plan view showing a display device according to one embodiment of the present disclosure. FIG. 2 is a cross-sectional view cut along line I-I' in FIG. 1. FIG. 3 is a plan view showing a method for performing laser trimming on the display device of FIG. 1. FIG. 4 is a cross-sectional view cut along line I-I' of FIG. 3. FIG. 5 to FIG. 7 are diagrams showing a structure of the display device after the laser trimming.

Referring to FIG. 1 and FIG. 2, a display device 1 can be configured to include a display panel 10, a back plate 20 and a cushion plate 30. The display device 1 can be adhered to a cover member by a module fixing member.

The display panel 10 can include a display substrate made of a polymer or a plastic such as polyimide (PI), or glass. The display panel 10 can include a display area AA for displaying an image and a non-display area NAA. A plurality of sub-pixels for displaying an image and a driver circuit for driving the plurality of sub-pixels can be disposed in the display area AA. A pixel array can include the plurality of sub-pixels and the driver circuit. The non-display area NAA can be formed to surround the display area and can refer to an area where no image is displayed.

A bezel can be the non-display area NAA surrounding the display area AA in the display apparatus to which the display device 1 is applied. The non-display area NAA of the display device 1 and the bezel can refer to the same area. A circuit board 100, a driver integrated circuit 110, and a current connector 120 connected to an external device can be disposed in the non-display area NAA.

In one embodiment of the present disclosure, a chip-on-film (COF) in which the driver integrated circuit 110 is directly mounted on the display panel 10 can be employed. The disclosure is not limited thereto. The circuit board 100 can be embodied as a flexible printed circuit board (FPCB), and the circuit board 100 can be directly mounted or attached to the display panel 10.

One end of the circuit board 100 can be attached to the non-display area NAA of the display panel 10, and the circuit board 100 can be bent such that the other end thereof is disposed on a back surface of the display panel 10 to reduce an area of a portion of the non-display area NAA of the display panel 10 visible in a frontward direction. Further, an end of the display panel 10 on which the circuit board 100 is mounted is bent to a certain level as the circuit board 100 is bent, so that an area of a portion of the non-display area NAA of the display panel 10 visible in the frontward direction can be further reduced.

In another embodiment, in order to reduce an area of the portion of the non-display area NAA of the display panel 10 visible in the frontward direction as much as possible, the display panel 10 can be bent such that one end of the display panel 10 can be disposed on the back surface of the display panel 10. In the bent state of the circuit board 100, the driver integrated circuit 110 can be disposed on the back surface of the display substrate.

As a radius of curvature by which the display panel 10 or the circuit board 100 is bent increases, an area of the portion of the non-display area of the display panel 10 visible in the frontward direction increases. Thus, an overall thickness of the display device 1 can be reduced to make a radius of curvature of the circuit board 100 smaller.

The pixel array including a thin-film transistor layer and a light emitting element can be disposed on the display panel 10. The pixel array includes a plurality of sub-pixels. Each of the plurality of sub-pixels can be an individual unit emitting light, and each light emitting element can be disposed in each of the plurality of sub-pixels.

The driver integrated circuit 110 generates a data signal and a gate control signal based on image data and a timing synchronization signal supplied from an external host driver system. Moreover, the driver circuit can supply the data signal to a data line of each pixel via a display pad, and can supply the gate control signal to a gate driver circuit via the display pad.

Because the driver integrated circuit 110 generates a large amount of heat, it can be necessary to effectively impart a heat dissipation effect to the driver integrated circuit 110. For example, the heat from the driver integrated circuit 110 can be effectively dissipated by the cushion plate 30.

The cushion plate 30 can be disposed between the display panel 10 and the driver integrated circuit 110, so that heats generated from not only the driver integrated circuit 110 but also the display panel 10 can be effectively dissipated by the cushion plate.

The back plate 20 can be disposed on the display panel 10. The back plate 20 can be disposed under the display substrate constituting the display panel 10 and can supplement rigidity of the display substrate. The back plate 20 can be formed to have a certain strength and a certain thickness to supplement the rigidity of the display substrate.

The cushion plate 30 can be disposed on the back plate 20. The cushion plate 30 can have a heat dissipation function and a shock absorption function, and can be composed of an adhesive member 31 and a conductive structure 32. For example, the adhesive member 31 and the conductive structure 32 can be sequentially stacked to constitute a back surface RS of the display device 1.

The conductive structure 32 is composed of a single structure of a porous substrate rather than a stacked structure of a heat dissipation layer and a cushion layer, so that interlayer separation does not occur. The conductive structure can have a heat dissipation function and a shock absorption function.

In one embodiment, a size of the cushion plate 30 can be smaller than a size of each of the display panel 10 and the back plate 20. When a size of the cushion plate 30 is larger than a size of the display panel 10, the non-display area can increase. Accordingly, in order not to increase the non-display area, the size of the cushion plate can be smaller than that of the back plate 20. On the contrary, when a size of the cushion plate 30 is smaller than that of the back plate 20, a weight thereof can be reduced and a manufacturing cost thereof can be reduced, but the heat dissipation and the shock absorption function thereof can be lowered.

Further, when the size of the cushion plate 30 is smaller than that of the back plate 20, a step occurs between the cushion plate 30 and the back plate 20. In a side end area of the display panel 10 where the step is formed, the display panel 10 protrudes while the display panel 10 is not supported on the cushion plate 30. Thus, the display panel 10 can be easily damaged when an external impact is applied thereto.

Accordingly, the display device 1 according to one embodiment of the present disclosure can be configured so that a side end E1 of the cushion plate 30 is aligned with a side end of each of the display panel 10 and the back plate 20 and the cushion plate entirely overlaps the display panel 10. For example, the display panel 10, the back plate 20 and the cushion plate 30 can be attached to each other such that the ends E1 of the display panel 10, the back plate 20 and the cushion plate 30 can be aligned with each other without causing a step therebetween.

In order that the ends E1 of the display panel 10, the back plate 20 and the cushion plate 30 are aligned with each other without causing a step therebetween, the display panel 10, the back plate 20 and the cushion plate 30 can have the same area size.

In this regard, when the display panel 10, the back plate 20 and the cushion plate 30 are attached to each other such that the ends E1 of the display panel 10, the back plate 20 and the cushion plate 30 can be aligned with each other without causing a step therebetween, it is difficult to form the display device 1 so as to have an accurate target size. Accordingly, the display device 1 is formed to have a size larger than the target size, and then the display device 1 is partially cut using a laser device to form the display device having the target size.

Specifically, referring back to FIG. 1, the display device 1 can be formed to have a size B larger than a target size A to be achieved.

Next, as shown in FIG. 3 and FIG. 4, a method of cutting a portion of the display device 1 inwardly from a side surface of the display device 1 using a laser device L to form the display device 1 of the target size A can be performed.

The laser device L can cut the display device 1 by irradiating a laser beam along the cutting line CL1 of the display device 1 in an arrow direction in FIG. 3. The cutting line CL1 can be formed along three sides of the display device 1. For example, the cutting line CL1 can be formed along an upper side, a left side, and a right side of the display device 1.

In this regard, since the circuit board 100 including the driver integrated circuit 110 and the current connector 120 is disposed at a lower side of the display device 1, it can be difficult to cut the lower side thereof using the laser. Accordingly, the cutting line CL1 can be formed except for the lower side of the display device 1. In this regard, the cutting line CL1 can overlap an area corresponding to the target size A to be achieved.

Referring to FIG. 4, the laser device L can irradiate the laser beam in a straight line in a direction from the back surface RS of the display device 1 composed of the cushion plate 30 to a front surface FS thereof composed of the display panel 10. Then, the display device 1 as a laminated structure which the cushion plate 30, the back plate 20 and display panel 10 are laminated with each other can be partially cut with the laser at once and can be processed such that the side surfaces of the cushion plate 30, the back plate 20 and the display panel 10 are aligned with each other.

In this regard, in the process of cutting the cushion plate 30, the back plate 20, and display panel 10 using the cutting method using the laser device L, an uneven conductive thin-film 40 can be formed as shown in FIG. 5.

The cutting method using the laser device L can be performed in a scheme of repeatedly irradiating an ultra-short pulse laser beam having a pulse duration in a femto-second range onto the cushion plate 30 of the display device 1. When the ultra-short pulse laser beam is repeatedly irradiated thereon, a material constituting the cushion plate 30 to which the laser beam is irradiated can be melted. According to an embodiment, for a period in which the laser pulse is continuously applied, the laser beam can be irradiated in an overlapping manner with the cutting line CL1 as a target point. Therefore, the cutting line CL1 irradiated with the laser pulse has a high temperature. When a subsequent laser pulse reaches the cutting line having the high temperature, a temperature of the cutting line exceeds a melting point of a material constituting the cushion plate 30, and melting thereof can start.

Then, a molten material of the cushion plate 30 can flow down toward the display panel 10. However, as the cutting line CL1 irradiated with the laser beam overlaps an area corresponding to the target size A to be achieved, the melting occurs in a side end portion of the cushion plate 30. In other words, an area of a melted portion is narrow. Accordingly, the conductive thin-film 40 composed of the material flowing down from the side end portion of the cushion plate 30 is thin and a surface thereof is uneven. Further, the conductive thin-film 40 can be formed in a disconnected and discontinuous manner rather being formed as a single connected film.

Further, while the cutting method using the laser device L is performed, the laser beam can be irradiated on the display device while the display device 1 is bent or while the display device 1 seated on the laser device L is in a misaligned state. Then, as shown in FIG. 6 and FIG. 7, the side surfaces of the cushion plate 30, the back plate 20, and the display panel 10 are not aligned with each other in a line, but are inclined as they goes toward the display panel 10, resulting in a slope phenomenon having an inclination angle θ.

When the ultra-short pulse laser beam is repeatedly irradiated while the side surfaces of the cushion plate 30, the back plate 20 and the display panel 10 are inclined in the above manner, a conductive thin-film 50 covering up to only a portion of the side surface of the back plate 20 can be formed even when the molten material of the cushion plate 30 flows down. In other words, the side surface of the display panel 10 is not covered with the molten material and is exposed.

As described above, in the side end portion of the display device 1, the conductive thin-films 40 and 50 can be thin and the surfaces thereof may not be uniform, and/or the films can be discontinuous or disconnected. For example, the films may not cover an entirety of the side end portion of the display device 1. Thus, charges may not be uniformly distributed throughout the display device 1 or may not be grounded through the back surface of the cushion plate 30 and thus can be accumulated in a specific location. Thus, fixed charges can be generated.

When the fixed charges do not move and accumulate at the specific location, the fixed charges can flow into the display panel 10 and lead to poor image quality when the display apparatus operates subsequently. For example, a defect in which green light is generated at a weak level in an organic light emitting element can occur, and thus the image quality can be deteriorated. As this defect is directly related to reliability problem of the display apparatus, the applicants of the present disclosure have invented a display device structure that can prevent such a defect.

The present disclosure will be described below with reference to the drawings.

Figure 8:
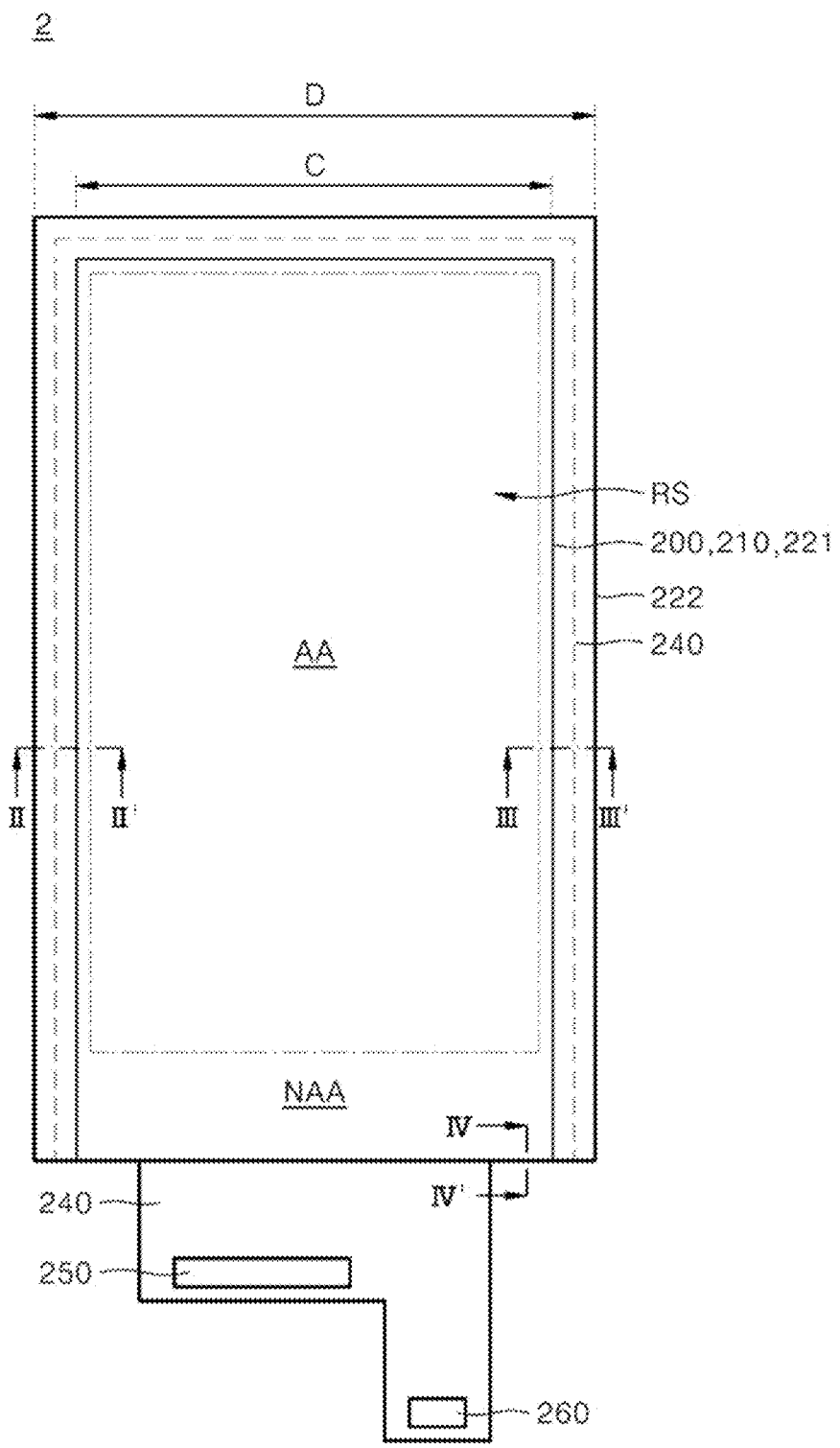
FIG. 8 is a plan view showing a display device according to another embodiment of the present disclosure.
Figure 9:
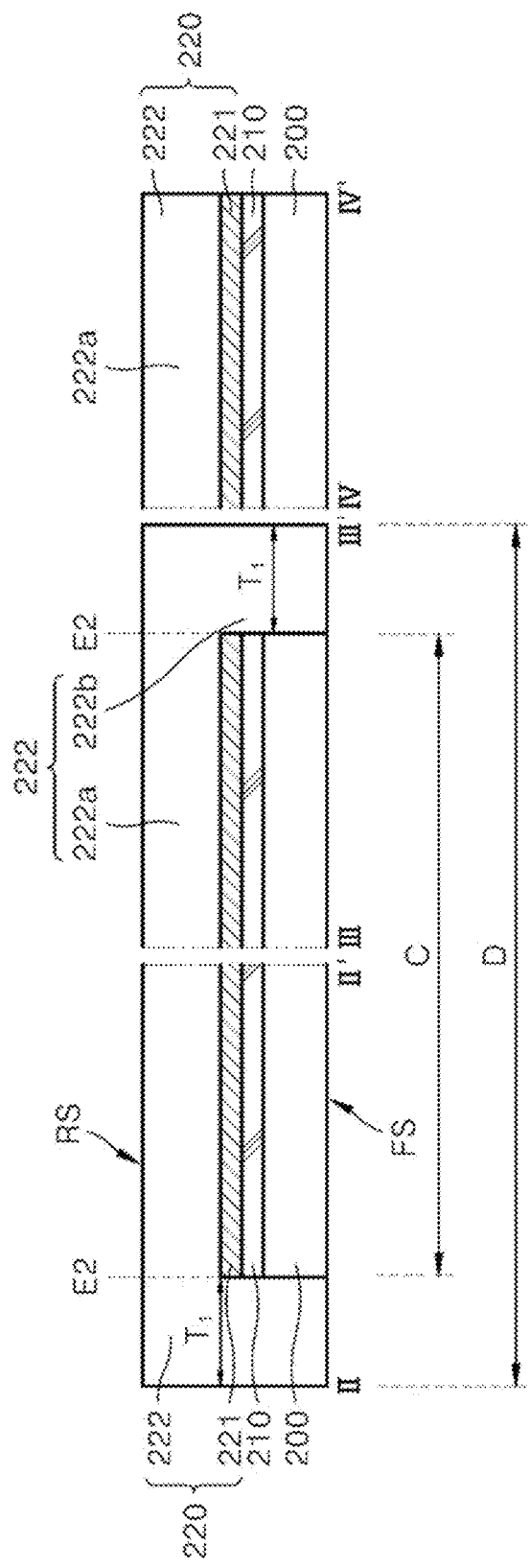
FIG. 9 is a cross-sectional view cut along lines and IV-IV' of FIG. 8.
Figure 10:
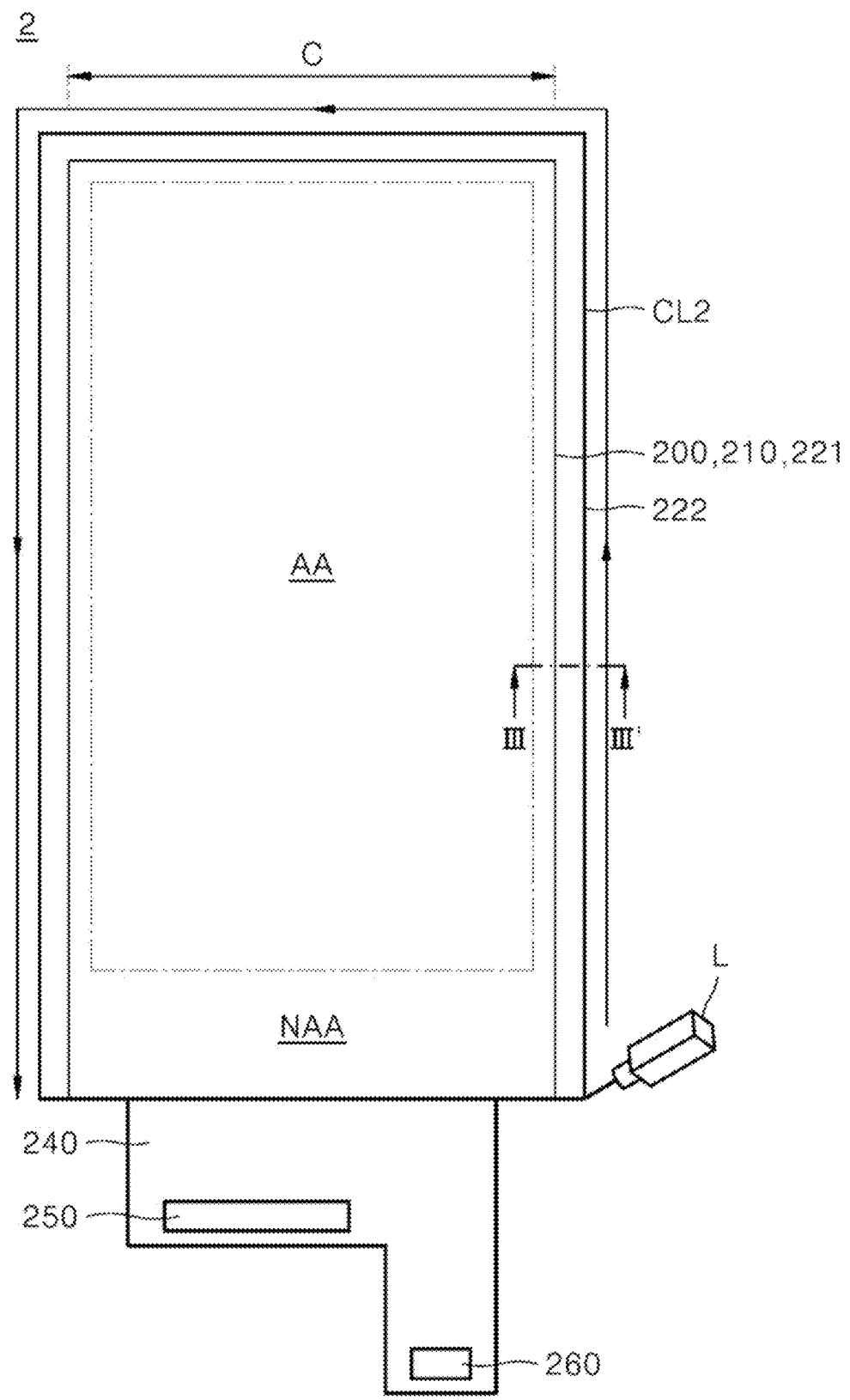
FIG. 10 is a plan view showing a method for performing laser trimming on the display device of FIG. 8.
Figure 11:
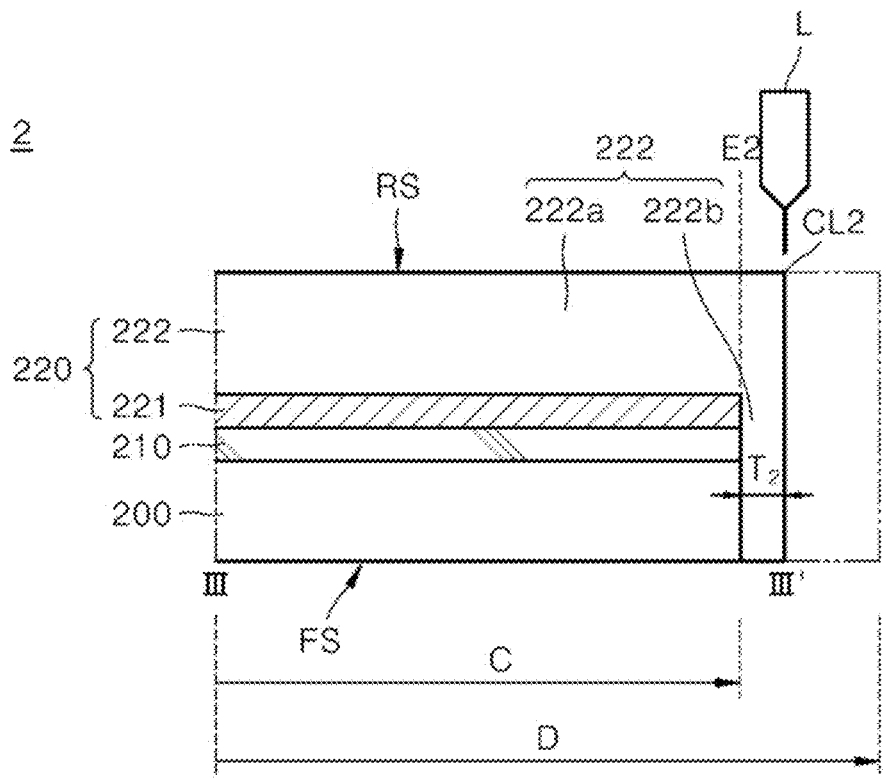
FIG. 11 is a cross-sectional view cut along line of FIG. 10.

FIG. 8 is a plan view showing a display device according to another embodiment of the present disclosure. FIG. 9 is a cross-sectional view cut along line and IV-IV' of FIG. 8. FIG. 10 is a plan view showing a method for performing laser trimming on the display device of FIG. 8. FIG. 11 is a cross-sectional view cut along line of FIG. 10.

Figure 12:
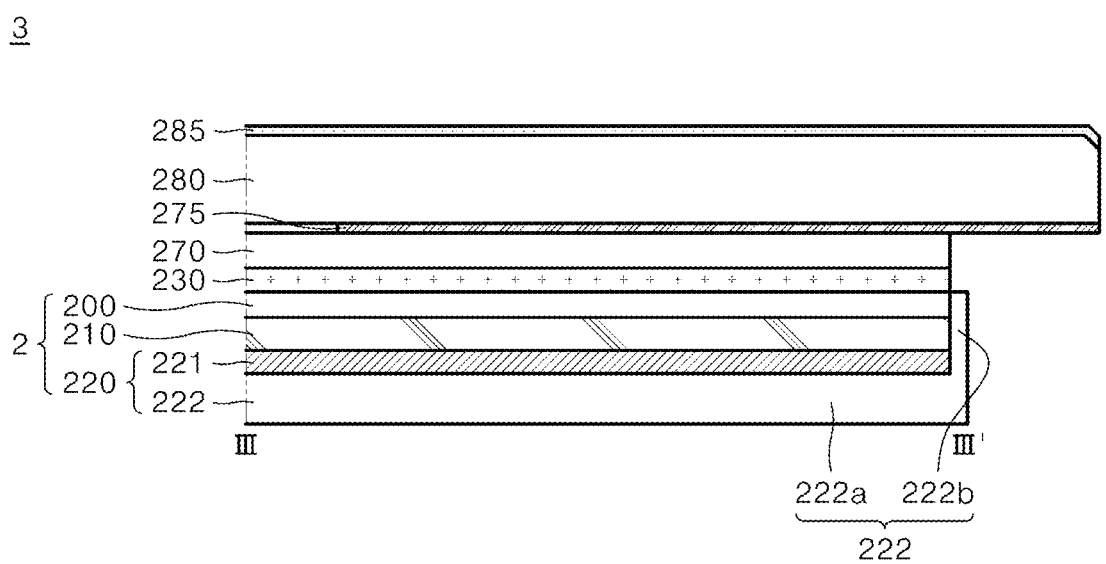
FIG. 12 is a diagram for illustrating a structure in which a display device and a cover member are coupled to each other according to another embodiment of the present disclosure.
Figure 13:
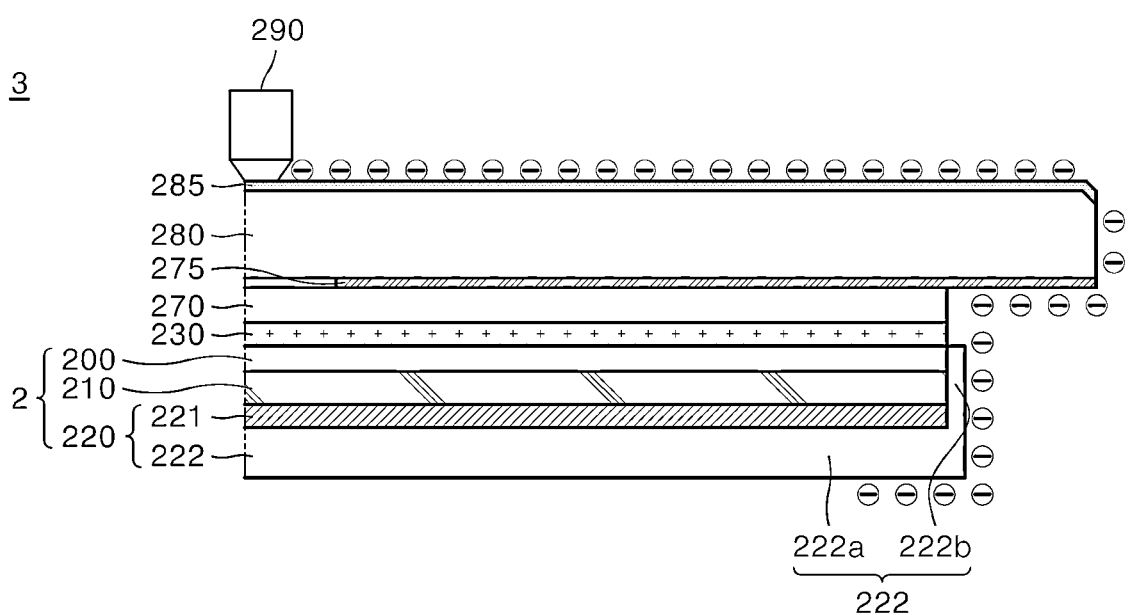
FIG. 13 is a diagram schematically showing that electric charges due to static electricity are discharged through a conductive thin-film in a display apparatus according to an embodiment of the present disclosure.

FIG. 12 is a diagram for illustrating a structure in which a display device and a cover member are coupled to each other according to another embodiment of the present disclosure. FIG. 13 is a diagram schematically showing that electric charges due to static electricity are discharged through a conductive thin-film in a display apparatus according to an embodiment of the present disclosure.

Referring to FIG. 8 and FIG. 9, a display device 2 can be configured to include a display panel 200, a back plate 210 and a cushion plate 220. The display device 2 can then be attached to a cover member by a module fixing member.

The display panel 200 can include a display substrate made of a flexible plastic material such as polyimide, or a flexible glass material.

The display panel 200 can include a display area AA for displaying an image, and a non-display area NAA.

A pixel array can be disposed in the display area AA. The pixel array can be implemented in a form of various elements for displaying images. The pixel array can include a plurality of pixels arranged in a pixel area defined by signal lines on a display substrate. The pixels can display an image based on signals supplied to the signal lines. The signal lines can include gate lines, data lines, and pixel driving power lines.

Each of the plurality of pixels can include a thin-film transistor in the pixel area, an anode electrode electrically connected to the thin-film transistor, a light-emitting element layer formed on the anode electrode, and a cathode electrode electrically connected to the light-emitting element layer.

The thin-film transistor can include a gate electrode, a semiconductor layer, a source electrode, and a drain electrode. The semiconductor layer of the thin-film transistor can include silicon such as a-Si, poly-Si, or low-temperature poly-Si, or oxide such as IGZO (Indium-Gallium-Zinc-Oxide).

The anode electrode can be disposed in each pixel area and in a corresponding manner to an opening area defined according to a pattern shape of the pixel and can be electrically connected to the thin-film transistor.

In one example, the light-emitting element layer can include an organic light-emitting element formed on the anode electrode. The organic light-emitting element can be implemented to emit light of the same color for pixels, such as white light, or to emit light beams of different colors for pixels, such as red, green, and blue light beams.

In another example, the light-emitting element layer can include a micro light-emitting diode element electrically connected to each of the anode electrode and the cathode electrode. The micro light-emitting diode element can be a light-emitting diode implemented in a form of an integrated circuit (IC) or a chip, and can include a first terminal electrically connected to the anode electrode and a second terminal electrically connected to the cathode electrode.

The cathode electrode can be commonly connected to light-emitting elements of the light-emitting element layer respectively disposed in the pixel areas.

An encapsulation portion is formed on the display substrate to cover the pixel array, thereby preventing oxygen, moisture, or foreign substances from penetrating into the light-emitting element layer of the pixel array. In one example, the encapsulation portion can be formed in a multilayer structure in which organic material layers and inorganic material layers are alternately stacked.

The non-display area NAA can be formed to surround the display area AA and can act as an area where no image is displayed, for example, a bezel area. A circuit board 240, a driver integrated circuit 250, and a current connector 260 connected to an external device can be disposed in the non-display area NAA.

The circuit board 240 can be embodied as a flexible printed circuit board (FPCB), and can be directly mounted or attached to the display panel 200. The driver integrated circuit 250 and the current connector 260 can be disposed on the circuit board 240.

One end of the circuit board 240 can be attached to the non-display area NAA and a front surface FS of the display panel 200. The circuit board can be bent such that the other end thereof is disposed on a back surface RS of the display panel 200 to reduce an area of a portion of the non-display area NAA of the display panel 200 visible in the frontward direction. Further, an end of the display panel 200 on which the circuit board 240 is mounted can be bent to a certain amount as the circuit board 240 is bent such that an area of a portion of the non-display area of the display panel 200 visible in the frontward direction can be further reduced.

The driver integrated circuit 250 can generate a data signal and a gate control signal based on image data and a timing synchronization signal supplied from an external host driver system and supply the generated signals to a data line and a gate line of each pixel.

The back plate 210 can be disposed on one surface of the display panel 200. The back plate 210 can be disposed under the display substrate constituting the display panel 200 and can supplement the rigidity of the display substrate. The back plate 210 can be formed to have a certain strength and a certain thickness to complement the rigidity of the display substrate.

The cushion plate 220 can be disposed on one surface of the back plate 210. The cushion plate 220 can have a heat dissipation function and a shock absorption function, and can be configured to include an adhesive member 221 and a conductive structure 222. One surface of the back plate 210 on which the cushion plate 220 is disposed can be an opposite surface different from the one surface thereof in contact with the display panel 200. For example, the adhesive member 221 and the conductive structure 222 can be sequentially stacked so as to constitute the back surface RS of the display device 2.

The adhesive member 221 can act as a layer that directly contacts the back plate 220 to fix the cushion plate 220 to the back plate 220. The adhesive member 221 can be made of or include a material such as a pressure sensitive adhesive (PSA), an optically clear adhesive (OCA), or an optically clear resin (OCR).

The conductive structure 222 is disposed on one surface of the adhesive member 221. In this regard, the one surface of the adhesive member 221 in contact with the conductive structure 222 can be opposite to a surface thereof in contact with the back plate 220.

The conductive structure 222 can include a porous metal structure including a metal as a main component, and having multiple pores therein. In one example, the conductive structure 222 can be formed by sintering a metal foam precursor including metal powders. However, the disclosure is not limited thereto. The metal foam precursor can be understood as a structure before a process such as sintering. Preferably, the conductive structure 222 includes Cu (copper).

For example, the metal foam precursor can be produced using a slurry including metal powders, a dispersant, and a binder.

The metal powders can include at least one metal powders selected from a group consisting of copper powders, nickel powders, iron powders, SUS powders, molybdenum powders, silver powders, platinum powders, gold powders, aluminum powders, chromium powders, indium powders, tin powders, magnesium powders, phosphorus powders, zinc powders, and manganese powders, or mixtures thereof, or alloy powders of one or more metals. The present disclosure is not limited thereto.

In one example, the dispersant can include alcohol, but is not limited thereto. A type of the binder is not particularly limited, and can be appropriately selected according to a type of a metal component or a type of the dispersant used during preparation of the slurry.

After the slurry including the metal powders, the dispersant and the binder as described above is prepared, the slurry can be injected into a mold having a predetermined shape or the slurry can be coated on a base. The metal foam precursor thus formed can be subjected to a sintering process and thus can formed into the conductive structure 222. In this case, conditions of the sintering process are not particularly limited as long as a temperature and a time duration thereof are met such that a solvent included in the slurry is removed by a desired amount.

According to one embodiment of the present disclosure, the conductive structure 222 can be formed by injecting the above-described slurry into the mold having a predetermined shape and performing the sintering process thereon.

According to another embodiment of the present disclosure, the conductive structure 222 can be composed of a metal film having flexibility.

In this regard, the conductive structure 222 can have a shape including an upper cover 222a covering a top surface of the adhesive member 221 and a side cover 222b covering all of exposed opposing side surfaces of each of the adhesive member 221, the back plate 210 and the display panel 200.

Accordingly, the conductive structure 222 can be formed to cover the top surface and three sides of the display device 2. As the circuit board 240 including the driver integrated circuit 250 and the current connector 260 is disposed at a lower side of the display device 2, the lower side of the display device 2 is not covered with the conductive structure 222. Accordingly, referring to a portion shown in FIG. 9 as acquired by cutting a lower side portion of the display device 2 along line IV-IV', the conductive structure 222 can cover only a top surface of the display device 2.

In one example, the display device 2 according to an embodiment of the present disclosure can be configured so that ends E2 of the display panel 200, the back plate 210, and the adhesive member 221 coincide with each other without causing a step. In order that the ends E2 of the display panel 200, the back plate 210, and the adhesive member 221 are aligned with each other without causing a step, the display panel 200, the back plate 210, and the adhesive member 221 can be formed to have the same area size.

In this regard, the display panel 200, the back plate 210, and the adhesive member 221 can be formed to have a target size of the display device 2 to be achieved. As the conductive structure 222 is disposed thereon, the side cover 222b of the conductive structure 222 can be formed to have a preliminary size D relatively larger than a target size C.

As shown in FIG. 9, the side cover 222b of the conductive structure 222 can be formed to horizontally protrude from the side end E2 of each of the display panel 200, the back plate 210 and the adhesive member 221 by a predefined horizontal dimension T1. For example, a horizontal dimension of the side cover 222b of the conductive structure 222 can be larger than 60 um. When the horizontal dimension of the side cover 222b of the conductive structure 222 is smaller than 60 um, the laser can be irradiated to the display panel 200 instead of the side cover 222b. Thus, the display panel can be damaged. Accordingly, the horizontal dimension of the side cover 222b of the conductive structure 222 can be larger than 60 um. The horizontal dimension may be a length extending in the width direction of the display panel, and the vertical dimension may be a length extending in the thickness direction of the display panel.

Further, the side cover 222b of the conductive structure 222 can be formed to have a length sized such that the side cover covers an entirety of each of exposed side surfaces of the display panel 200. In one example, the side cover 222b can be formed to have a length of 190 um to 230 um extending from a surface of the upper cover 222a.

Next, as shown in FIG. 10 and FIG. 11, a trimming process can be performed to cut a portion of the side cover 222b of the conductive structure 222 inwardly from the side end thereof using the laser device L to form the display device 2 of the target size C.

The trimming process can be understood as a process of removing an unnecessary portion by irradiating a laser beam to a trimming target along the cutting line CL2 using the laser device L to cut the trimming target. The cutting line CL2 in the trimming process according to an embodiment of the present disclosure can be formed along three sides of the display device 2 including the conductive structure 222. For example, the cutting line CL2 can be formed along an upper side, a left side, and a right side of the display device 2.

In this regard, the cutting line CL2 can overlap the conductive structure 222 except for the display panel 200, the back plate 210, and the adhesive member 221.

The conductive structure 222 is not formed at a lower side of the display device 2 at which the circuit board 240 is disposed. Thus, it is difficult to cut the lower side thereof using the laser. Accordingly, the cutting line CL2 can be formed except for the lower side of the display device 2. In this regard, the cutting line CL2 can overlap an area corresponding to the target size C to be achieved.

The laser device L can irradiate the laser beam in a straight line in a direction from the back surface RS of the display device 2 at which the conductive structure 222 is disposed to the front FS thereof at which the display panel 200 is disposed. As described above, the cutting line CL2 overlaps the side cover 222b of the conductive structure 222 except for the display panel 200, the back plate 210, and the adhesive member 221. Accordingly, the laser beam irradiated from the laser device L can be irradiated onto the side cover 222b of the conductive structure 222 to cut away the side cover so as to leave a predefined horizontal dimension thereof. A horizontal dimension T2 of the side cover 222b of the conductive structure 222 remaining after the cutting process using the laser beam can be smaller than 60 um. For example, the horizontal dimension T2 can be in a range of 30 um to 59 um.

The cutting method using the laser device L can be performed in a scheme of repeatedly irradiating an ultra-short pulse laser beam having a pulse duration in a femtosecond range onto the side cover 222b of the conductive structure 222. When the ultra-short pulse laser beam is repeatedly irradiated thereon, a material constituting the side cover 222b to which the laser beam is irradiated can be melted. According to an embodiment, for a period in which the laser pulse is continuously applied, the laser beam can be irradiated in an overlapping manner with the cutting line CL2 as a target point. Therefore, the cutting line CL2 irradiated with the laser pulse has a high temperature. Thus, a temperature of the cutting line CL2 rises up, so that the temperature exceeds a melting point of the material constituting the side cover 222b of the conductive structure 222, and thus, the melting can start in the cutting line CL2.

Then, the molten material constituting the side cover 222b of the conductive structure 222 can flow down toward the display panel 200. In this case, the side cover 222b according to an embodiment of the present disclosure is formed to protrude from the side end E2 of each of the display panel 200, the back plate 210 and the adhesive member 221 by a predefined horizontal dimension T1. Specifically, the horizontal dimension of the side cover 222b is smaller than 60 um.

In other words, while an area of a portion to be melted is enlarged by the predefined horizontal dimension T1 from the side end E2, the laser trimming proceeds. Thus, when the melting of the material occurs at the side end E2 and the molten material flows down, a horizontal dimension of the molten material is sufficient such that the material covers the side surface of the display device 2 and a flat and uniform surface of the side portion made of the molten material is secured. Further, while the area of the portion to be melted is enlarged from the side end E2 by the predefined horizontal dimension T1, the laser trimming is performed, such that even after the laser trimming, a disconnected portion is not generated but a single connected film can be formed.

In another example, as the melting occurs at the side end E2 and the molten material flows down toward the display panel 200, the side cover 222b of the conductive structure 222 after the laser trimming can have a horizontal dimension increasing as it extends toward the display panel 200.

In an embodiment of the present disclosure, while the side cover 222b of the conductive structure 222 protrudes from the side end of each of the display panel 200, the back plate 210 and the adhesive member 221, the laser trimming process is performed. Thus, the display panel 200, the back plate 210 and the adhesive member 221 may not be removed away during the laser trimming. Accordingly, the side surfaces of the display panel 200, the back plate 210, and the adhesive member 221 can be maintained at an aligned state with each other in a line and may not have an inclination. That is, a portion of the conductive structure 222 covering the side surfaces of the adhesive member 221, the back plate 210, and the display panel 200 vertically extends so as to have a flat vertical surface.

Further, as the melting occurs at the side end E2 and the melted material flows down toward the display panel 200, interfacial adhesion between the display panel 200, the back plate 210, and the adhesive member 221 and the conductive structure 222 can be further improved.

Referring to FIG. 12, a display apparatus 3 can be manufactured by attaching the display device 2 including the conductive structure 222 to the cover member 280.

To this end, an optical film 230 can be disposed on the display panel 200. The optical film 230 can have a form in which one or more functional layers are stacked. However, the disclosure is not limited thereto. For example, the optical film 230 can include an anti-reflection layer such as a polarizing film (POL) which can prevent reflection of external light to improve outdoor visibility and contrast of an image displayed on the display panel 200. In another example, the optical film 230 can further include a barrier layer to prevent penetration of moisture or oxygen. The barrier layer can be made of a material having low moisture permeability, such as a polymer material. The display panel 200 and the optical film 230 can be bonded to each other by an adhesive member.

The cover member 280 can be coupled to the display device 2 on which the optical film 230 has been formed. For example, a module fixing member 270 can be disposed on a back surface of the cover member 280. Since the module fixing member 270 can be disposed to overlap the display area, the module fixing member 270 can be composed of an adhesive member made of a transparent material. For example, the module fixing member 270 can be made of or include a material such as optically clear adhesive (OCA) or optically clear resin (OCR).

Accordingly, the display device 2 can be fixedly coupled to the cover member 280 by the module fixing member 270. The cover member 280 can be disposed to cover an entire surface of the display device 2 to protect the display device 2 from external impact. Because the cover member 280 includes the display area AA that displays a screen, the cover member can be made of a transparent material such as a cover glass to display the screen. For example, the cover member 280 can be made of a transparent plastic material, a glass material, or a reinforced glass material.

An anti-fingerprint coating film 285 can be disposed on a front surface of the cover member 280. The anti-fingerprint coating film 285 can be formed by applying a material including fluorine-based silane on a surface of the cover member 280 made of glass or plastic and can serve to prevent fingerprints or contaminants from adhering thereto and facilitate removal of the fingerprints or contaminants therefrom. The anti-fingerprint coating film 285 can be formed to cover up to an edge portion of the cover member 280.

A light-blocking film 275 can be disposed between the cover member 280 and the module fixing member 270. The light-blocking film 275 can be disposed on an edge portion of a back surface of the cover member 280 and can be formed in the non-display area NAA. The light-blocking film 275 can be formed by applying black ink.

In the present disclosure, a configuration in which the conductive structure 222 is disposed on a structure in which the display panel 200 and the back plate 210 are attached to each other is described. The disclosure is not limited thereto. For example, in another embodiment, the conductive structure 222 can be disposed on a structure in which the display panel 200, the back plate 210, and the optical film 230 are attached to each other. In this case, the side cover 222b of the conductive structure 222 can be formed to cover a side surface of the optical film 230.

The conductive structure 222 according to an embodiment of the present disclosure can have a shape covering the back surface and the side surface of the display panel 200. As the conductive structure 222 having this shape serves as a ground, electric charges or static electricity applied to a top surface of the cover member 280 can be discharged to an outside through the back surface of the conductive structure 222. This can allow the charges to be uniformly distributed throughout the display device 1 while the fixed charges are not accumulated at a specific location, thereby preventing occurrence of image quality defects.

Specifically, as shown in FIG. 13, it can be identified that when an electrostatic test using a brass rod 290 is conducted, the electric charges move through the conductive structure 222 covering the side surface of the display device 2 toward the back surface of the conductive structure 222 such that no charge is accumulated at a specific location. In this regard, the side surface of each of the optical film 230 and the module fixing member 270 is not covered with the conductive structure 222. However, the charges can move to the conductive structure 222 under action of an air pass in which the charges move into an air due to an electric force attracting charges of copper as the material of the conductive structure 222 and then can be discharged to the outside.

The static electricity test refers to an evaluation test using a brass rod 290. In this test, the brass rod 290 can be repeatedly rubbed against the surface of the cover member 280 to induce static electricity.

Further, according to an embodiment of the present disclosure, the side surface of the display panel 200 of the display device is entirely covered with the conductive structure 222. This can prevent the image quality defect which can otherwise occur due to inflow of the electric charges through the side surface of the display panel 200.

Further, in the cutting process using the laser device, the laser beam is continuously irradiated to the display device and along the cutting line, damage to the display device can occur. The damage to the display device can lead to a defect in the display apparatus. Accordingly, there is a need for a method capable of reducing the damage caused by laser beam irradiation.

The method for reducing the damage will be described below with reference to the drawings.

Figure 14:
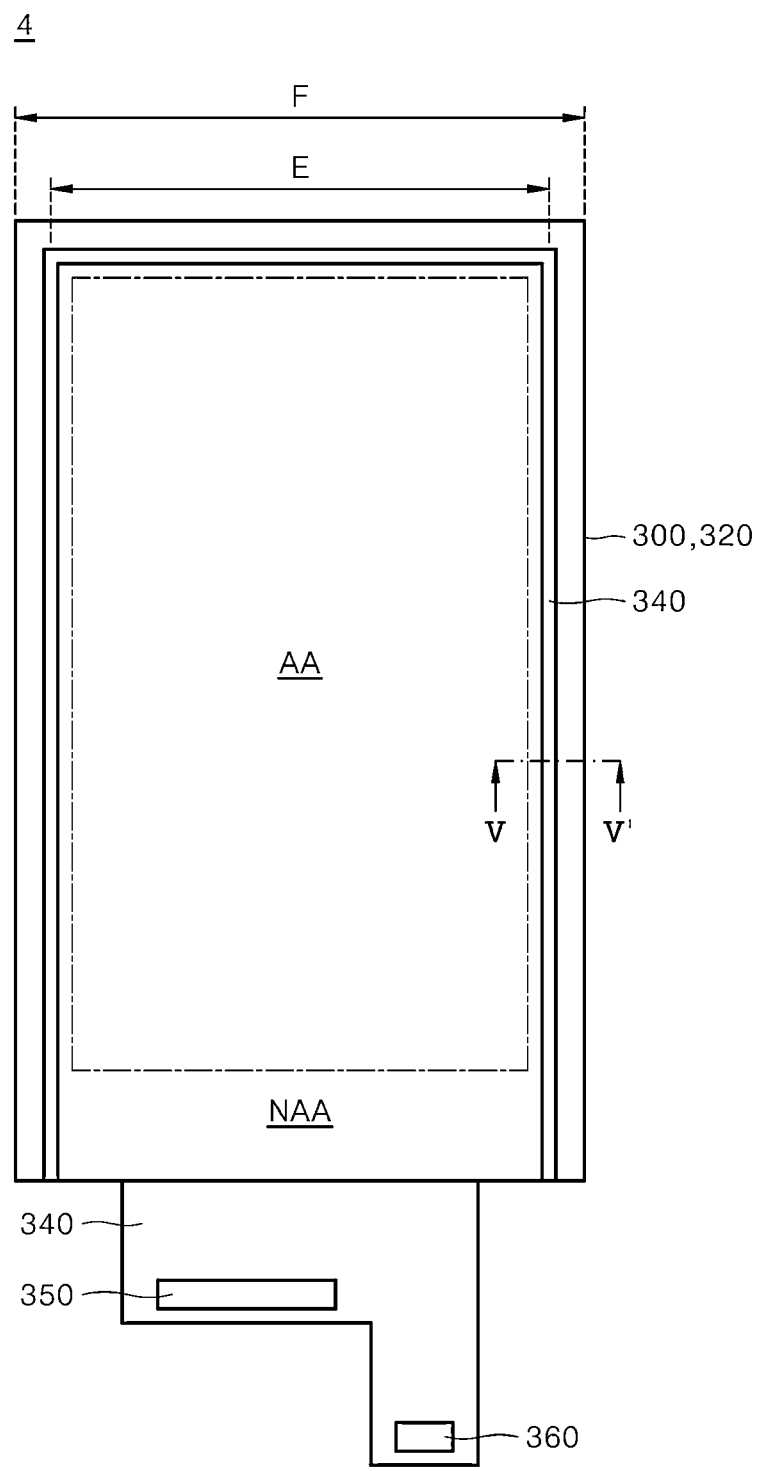
FIG. 14 is a diagram showing a display device according to still another embodiment of the present disclosure.
Figure 15:
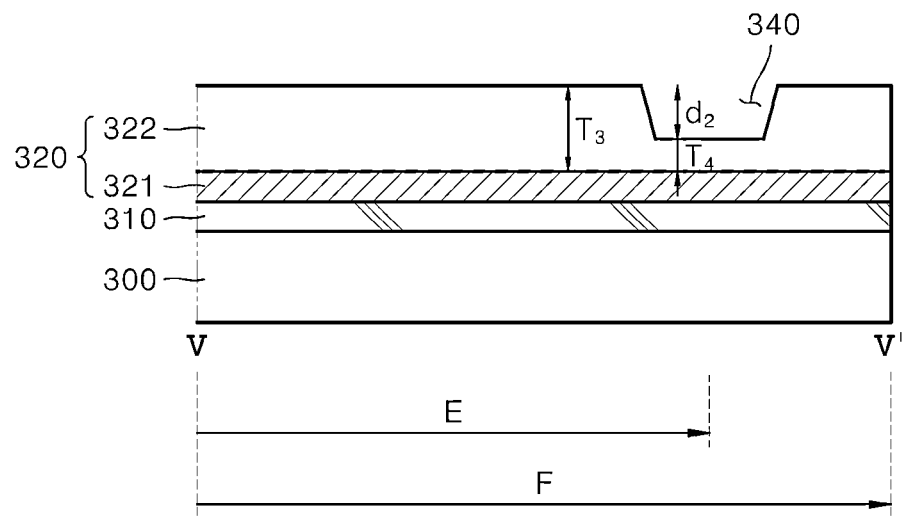
FIG. 15 is a cross-sectional view cut along line V-V' of FIG. 14.
Figure 16:
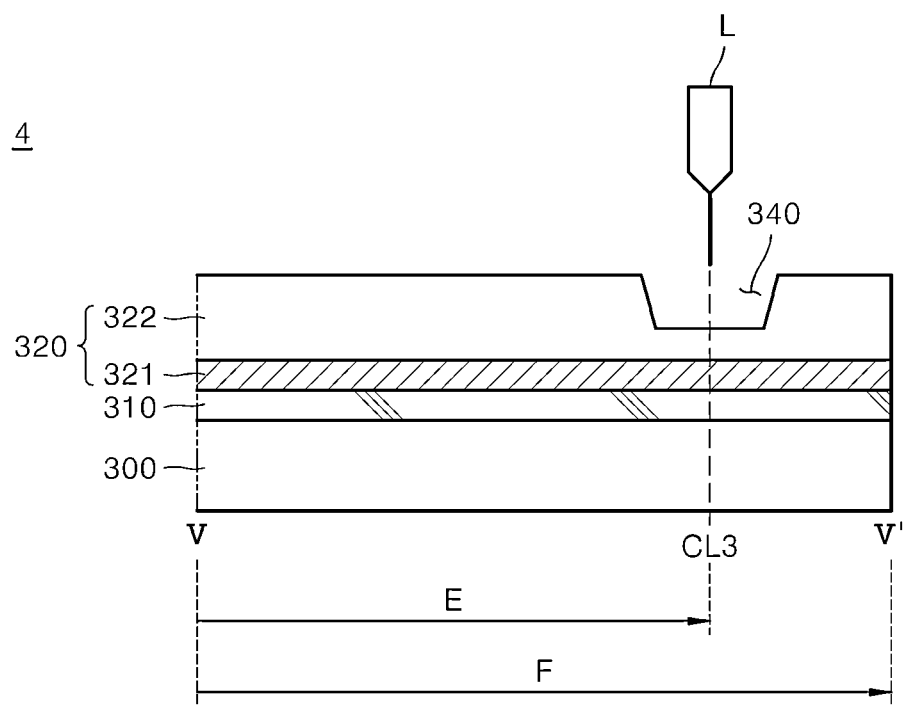
FIG. 16 and FIG. 17 are diagrams for illustrating a method of performing laser trimming according to still another embodiment of the present disclosure.
Figure 17:
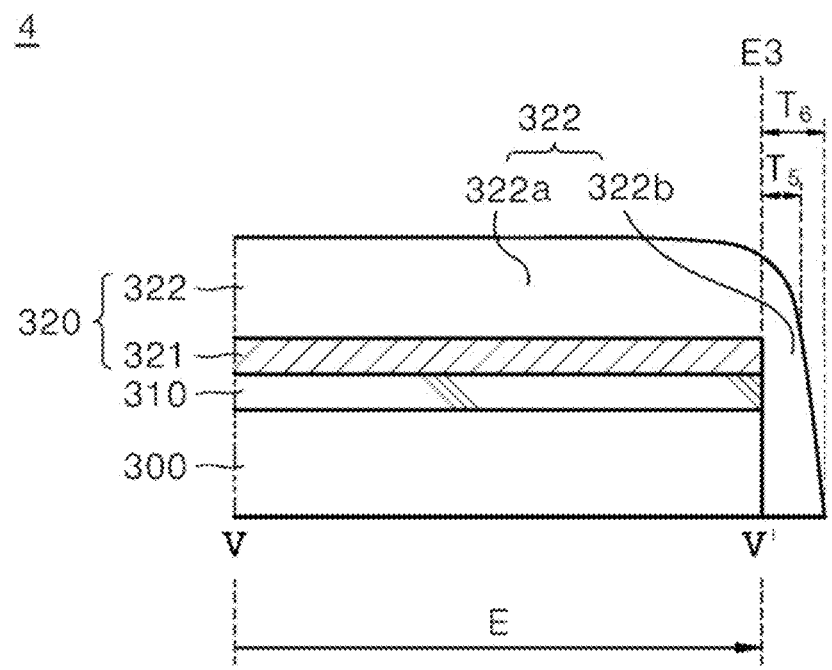

FIG. 14 is a diagram showing a display device according to another embodiment of the present disclosure. FIG. 15 is a cross-sectional view cut along line V-V' of FIG. 14. FIG. 16 and FIG. 17 are diagrams for illustrating a method of performing laser trimming according to still another embodiment of the present disclosure.

Referring to FIG. 14 and FIG. 15, a display device 4 can be configured to include a display panel 300, a back plate 310 and a cushion plate 320. The display device 4 can then be attached to the cover member by the module fixing member. In this regard, the same or similar components to those of FIG. 8 and FIG. 9 will be briefly described.

The display panel 300 can include a display substrate made of a flexible plastic material such as polyimide, or a flexible glass material.

The display panel 300 can include a display area AA for displaying an image and a non-display area NAA. The non-display area NAA can be formed to surround the display area AA and can act as an area where no image is displayed, for example, a bezel area. A circuit board 340, a driver integrated circuit 350, and a current connector 360 connected to an external device can be disposed in the non-display area NAA. One end of the circuit board 340 can be attached to the non-display area NAA and the front surface of the display panel 300.

The driver integrated circuit 350 can supply a signal to a data line and a gate line of each pixel.

The back plate 310 can be disposed on one surface of the display panel 300. The back plate 310 can be disposed under the display substrate constituting the display panel 300 and can supplement the rigidity of the display substrate. The back plate 310 can be formed to have a certain strength and a certain thickness to complement the rigidity of the display substrate. The cushion plate 320 can be disposed on one surface of the back plate 310. The cushion plate 320 can have a heat dissipation function and a shock absorption function, and can be configured to include an adhesive member 321 and a conductive structure 322.

The adhesive member 321 can act as a layer that directly contacts the back plate 320 to fix the cushion plate 320 to the back plate 320. The adhesive member 321 can be made of or include a material such as a pressure sensitive adhesive (PSA), an optically clear adhesive (OCA), or an optically clear resin (OCR).

The conductive structure 322 is disposed on one surface of the adhesive member 321. In this regard, the one surface of the adhesive member 321 in contact with the conductive structure 322 can be opposite to a surface thereof in contact with the back plate 320.

The conductive structure 322 can include a porous metal structure including a metal as a main component, and having multiple pores therein. In one example, the conductive structure 322 can be formed by sintering a metal foam precursor including metal powders. However, the disclosure is not limited thereto. The metal foam precursor can be understood as a structure before a process such as sintering. For example, the metal foam precursor can be produced using a slurry including metal powders, a dispersant, and a binder. After the slurry including the metal powders, the dispersant and the binder as described above is prepared, the slurry can be injected into a mold having a predetermined shape or the slurry can be coated on a base. The metal foam precursor thus formed can be subjected to a sintering process and thus can formed into the conductive structure 322.

According to one embodiment of the present disclosure, the conductive structure 222 can be formed by injecting the above-described slurry into the mold having a predetermined shape and performing the sintering process thereon. According to another embodiment of the present disclosure, the conductive structure 322 can be composed of a metal film having flexibility.

In one example, the conductive structure 322 can include Cu (copper). Side surfaces of the display panel 300, the back plate 310, and the conductive structure 322 are aligned with each other without causing a step. For example, each of the display panel 300 and the back plate 310 can be formed to have the same area size as that of the conductive structure 322.

In this regard, the display device 4 including the display panel 300, the back plate 310, the adhesive member 321 and the conductive structure 322 can be formed to have a size F that is relatively larger than a target size E to be achieved.

In one example, a trench 340 having a concave bottom surface and both opposing sides' walls can be disposed in an edge portion of the conductive structure 322. The trench 340 can be disposed to overlap an outer edge of an area corresponding to the target size E of the conductive structure 322. The trench 340 can be formed to have a predefined depth d2 from a top surface of the conductive structure 322.

In one example, the trench 340 formed in the conductive structure 322 can be formed by injecting the slurry including the metal powders, the dispersant and the binder as described above into a mold having a trench shape or can be formed by forming the conductive structure in a plate shape, and then applying a pressure onto the plate using a mold having a trench shape.

The depth d2 of the trench 340 from the top surface of the conductive structure 322 may not exceed 30% of a total thickness T3 of the conductive structure. In one example, the depth d2 can be in a range of 20% to 30% of the total thickness T3. When the depth d2 of the trench 340 exceeds 30% of the total thickness T3 of the conductive structure 322, the depth deviates out of a laser tolerance in the laser trimming process using the laser device such that the laser may not be irradiated to a desired position. Further, when the depth d2 of the trench 340 is smaller than 20% of the total thickness T3 of the conductive structure 322, the slope phenomenon can occur in which the side surfaces of the cushion plate 30, the back plate 20, and display panel 10 are not aligned with each other but are inclined as they go toward the display panel 10 at the inclination angle θ as shown in FIG. 6.

Further, when the depth d2 of the trench 340 is smaller than 20% of the total thickness T3 of the conductive structure 322, the damage to the display panel due to the laser can occur as a laser beam irradiation time increases. Thus, the display apparatus can be defective.

Next, as shown in FIG. 16, the laser trimming process of cutting the display device 4 along the cutting line CL3 of the display device 4 having the conductive structure 322 disposed thereon is performed through the laser device L. The laser trimming process can irradiate the laser beam from the back surface of the display device 4 toward the front surface thereof where the display panel 300 is disposed, along the cutting line CL3, thereby cutting the display device 4 into the target size E.

The cutting line CL3 can be formed along three sides of the display device 4. For example, the cutting line CL3 can be formed along upper, left and right sides of the display device 4. The cutting line CL3 can overlap the trench 340.

When the laser beam is irradiated onto the cutting line CL3, for example, the trench 340, a temperature of the trench 340 rises up. Thus, melting can start while the temperature exceeds the melting point of the material constituting the conductive structure 322.

Then, during the laser trimming, the material constituting the conductive structure 322 flows down toward the display panel 300. In this regard, the material can flow down from the side walls and the bottom surface of the trench 340 toward the display panel 300.

Then, as shown in FIG. 17, a side cover 322b of the conductive structure 322 covering side walls of the adhesive member 321, the back plate 310 and the display panel 300 is formed. The conductive structure 322 is configured to include an upper cover 322a and the side cover 322b. In one example, the side cover 322b of the conductive structure 322 can be constructed such that a horizontal dimension T6 of a portion thereof covering the sidewall of the display panel 300 is relatively larger than a horizontal dimension T5 of a portion thereof covering the sidewall of the adhesive member 321.

When the laser beam is irradiated to the display device 4 while the trench 340 has been formed in the conductive structure 322, a time duration for which the laser beam is irradiated can be reduced by the depth of the trench 340. Thus, a damage which may be caused by the laser can be reduced, thereby preventing the display apparatus from being defective.

A scope of protection of the present disclosure should be construed by the scope of the claims, and all technical ideas within the scope equivalent thereto should be construed as being included in the scope of the present disclosure. Although the embodiments of the present disclosure have been described in more detail with reference to the accompanying drawings, the present disclosure is not necessarily limited to these embodiments. The present disclosure can be implemented in various modified manners within the scope not departing from the technical idea of the present disclosure.

Accordingly, the embodiments disclosed in the present disclosure are not intended to limit the technical idea of the present disclosure, but to describe the present disclosure. The scope of the technical idea of the present disclosure is not limited by the embodiments. Therefore, it should be understood that the embodiments as described above are illustrative and non-limiting in all respects. The scope of protection of the present disclosure should be interpreted by the claims, and all technical ideas within the scope of the present disclosure should be interpreted as being included in the scope of the present disclosure.

What is claimed is:

1. A display apparatus comprising:
a display panel;
a back plate on one surface of the display panel; and
a cushion plate including:
an adhesive member on one surface of the back plate; and
a conductive structure on one surface of the adhesive member,
wherein the conductive structure cover a side surface of the back plate and a side surface of the display panel and a side surface of the adhesive member.

2. The display apparatus of claim 1, wherein the side surface of the display panel, the side surface of the back plate and the side surface of the adhesive member are aligned with each other.

3. The display apparatus of claim 1, wherein the conductive structure covers the side surface of the display panel, the side surface of the back plate, and extends toward a side surface of the adhesive member.

4. The display apparatus of claim 1, wherein the conductive structure includes:
an upper cover on the one surface of the adhesive member; and a side cover extending from the upper cover and covering the side surface of the back plate, the side surface of the display panel and the side surface of the adhesive member.

5. The display apparatus of claim 4, wherein the side cover protrudes from the side surface of each of the display panel, the back plate and the adhesive member.

6. The display apparatus of claim 1, wherein the display apparatus further comprises:
an optical film on an opposite surface of the display panel to the one surface of the display panel on which the back plate is disposed; and
a cover member on one surface of the optical film.

7. The display apparatus of claim 6, wherein the conductive structure covers a side surface of the optical film.

8. The display apparatus of claim 1, wherein a horizontal dimension of a portion of the conductive structure covering the side surface of the display panel is larger than a horizontal dimension of a portion of the conductive structure covering the side surface of each of the adhesive member and the back plate.

9. The display apparatus of claim 2, wherein upper sides of the display panel, the back plate and the adhesive member are aligned with each other,
left sides of the display panel, the back plate and the adhesive member are aligned with each other, and
right sides of the display panel, the back plate and the adhesive member are aligned with each other.

10. The display apparatus of claim 1, wherein the conductive structure has multiple pores formed therein and includes Cu (copper).

11. The display apparatus of claim 1, wherein a dimension of the conductive structure horizontally extending from the side surface of the back plate, the side surface of the display panel and the side surface of the adhesive member is smaller than about 60 um.

12. The display apparatus of claim 1, wherein a portion of the conductive structure covers the side surface of the adhesive member, the side surface of the back plate, and the side surface of the display panel to have a flat surface.

13. The display apparatus of claim 1, wherein the one surface of the back plate on which the adhesive member is disposed is an opposite surface of one surface of the back plate on which the display panel is disposed, the one surface of the adhesive member on which the conductive structure is disposed is an opposite surface of one surface of the adhesive member on which the back plate is disposed.

14. A method for manufacturing a display apparatus, the method comprising:
providing a display device including a display panel, a back plate on the display panel, and a cushion plate on the back plate,
wherein the cushion plate includes an adhesive member on the back plate, and a conductive structure,
wherein the conductive structure includes an upper cover on one surface of the adhesive member,
wherein side surfaces of the display panel, the back plate, and the adhesive member are aligned with each other,
wherein the conductive structure further includes a side cover extending from the upper cover and covering the side surfaces of the adhesive member, the back plate, and the display panel,
wherein the side cover has a first horizontal dimension; and
performing a trimming process for cutting away a portion of the side cover of the conductive structure inwardly from a side surface thereof.

15. The method of claim 14, wherein the side cover is formed along upper, left, and right side surfaces of the display device.

16. The method of claim 14, wherein the performing of the trimming process includes a laser trimming process and carried out along a cutting line overlapping the side cover of the conductive structure, and
wherein the cutting line is formed along the upper, left and right edges of the display device.

17. The method of claim 14, wherein the first horizontal dimension of the side cover is larger than about 60 um, and the second horizontal dimension thereof is smaller than about 60 um.

18. The method of claim 14, wherein the side cover of the conductive structure is formed so that a horizontal dimension thereof increases as the side cover extends from the adhesive member toward the display panel.

19. The method of claim 14, wherein the method further comprises, after the performing of the trimming process:
disposing an optical film on the display panel; and
disposing a cover member on the optical film and the cover member is coupled to the display device.

20. A method for manufacturing a display apparatus, the method comprising:
providing a display device including a display panel, a back plate on the display panel, and a cushion plate on the back plate,
wherein the cushion plate includes an adhesive member on the back plate, and a conductive structure on the adhesive member,
wherein side surfaces of the display panel, the back plate, and the cushion plate are aligned with each other in a line,
wherein a trench having a bottom surface and sides walls is in an edge portion of the conductive structure; and
performing a trimming process for cutting a portion of the display device inwardly from a side surface of the display device using the bottom surface of the trench as a cutting line;
forming the conductive structure melts and flows to form an upper cover disposed on one surface of the adhesive member, and a side cover extending from the upper cover so as to cover the side surfaces of the adhesive member, the back plate, and the display panel.

21. The method of claim 20, wherein the trench extends along upper, left and right sides of the display device.

22. The method of claim 20, wherein the performing of the trimming process includes a laser trimming process and is carried out along the cutting line, and
wherein the cutting line extends along the upper, left and right edges of the display device.

23. The method of claim 20, wherein a depth of the trench from a top surface of the conductive structure is in a range of about 20% to 30% of a total thickness of the conductive structure.

24. The method of claim 20, wherein the side cover of the conductive structure has a horizontal dimension increasing as the side cover extends from the adhesive member toward the display panel.

* * * * *